(12) United States Patent
Kanagawa et al.

(10) Patent No.: US 8,074,144 B2
(45) Date of Patent: Dec. 6, 2011

(54) SEMICONDUCTOR STORAGE DEVICE

(75) Inventors: Naoaki Kanagawa, Yokohama (JP);
Kazuaki Kawaguchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1108 days.

(21) Appl. No.: 11/848,679

(22) Filed: Aug. 31, 2007

(65) Prior Publication Data
US 2008/0056025 A1  Mar. 6, 2008

(30) Foreign Application Priority Data

Sep. 1, 2006 (JP) ................................. 2006-237285

(51) Int. Cl.
*H03M 13/00* (2006.01)
(52) U.S. Cl. ......................... 714/758; 714/768; 714/774
(58) Field of Classification Search .................. 714/758, 714/768, 800, 774
See application file for complete search history.

(56) References Cited

U.S. PATENT DOCUMENTS

| | | | | |
|---|---|---|---|---|
| 4,679,196 A | * | 7/1987 | Tsujimoto | 714/804 |
| 4,809,278 A | | 2/1989 | Kim et al. | |
| 5,448,578 A | * | 9/1995 | Kim | 714/766 |
| 6,067,656 A | * | 5/2000 | Rusu et al. | 714/768 |
| 6,535,452 B2 | * | 3/2003 | Okuda et al. | 365/230.03 |
| 6,597,595 B1 | | 7/2003 | Ichiriu et al. | |
| 7,032,142 B2 | | 4/2006 | Fujioka et al. | |
| 2006/0156213 A1 | | 7/2006 | Kikutake et al. | |

FOREIGN PATENT DOCUMENTS

| | | |
|---|---|---|
| JP | 6-68700 | 3/1994 |
| JP | 2002-33360 | 1/2002 |
| JP | 2003-173698 | 6/2003 |
| JP | 2006-172649 | 6/2006 |

OTHER PUBLICATIONS

Office Action issued Aug. 31, 2011 in Taiwanese Application No. 096130199 filed Aug. 15, 2007 (w/English translation).

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

Plural data lines read normal data stored in a first area in the memory cell array when the data lines are connected to a selected bit line. Plural parity data lines read parity data from a second area in the memory cell array different from the first area, the parity data being used for an error correction of the normal data stored in the memory cell. A first determination circuit compares the normal data read from the data lines and their expectation value, respectively, and determines whether the data and the expectation value coincide, respectively. A second determination circuit compares the parity data read from the parity data lines and their expectation value, respectively, and determines whether the data and the expectation value coincide, respectively. The second determination circuit includes a selection circuit that selectively outputs a determination result on a part of the parity data lines.

12 Claims, 15 Drawing Sheets

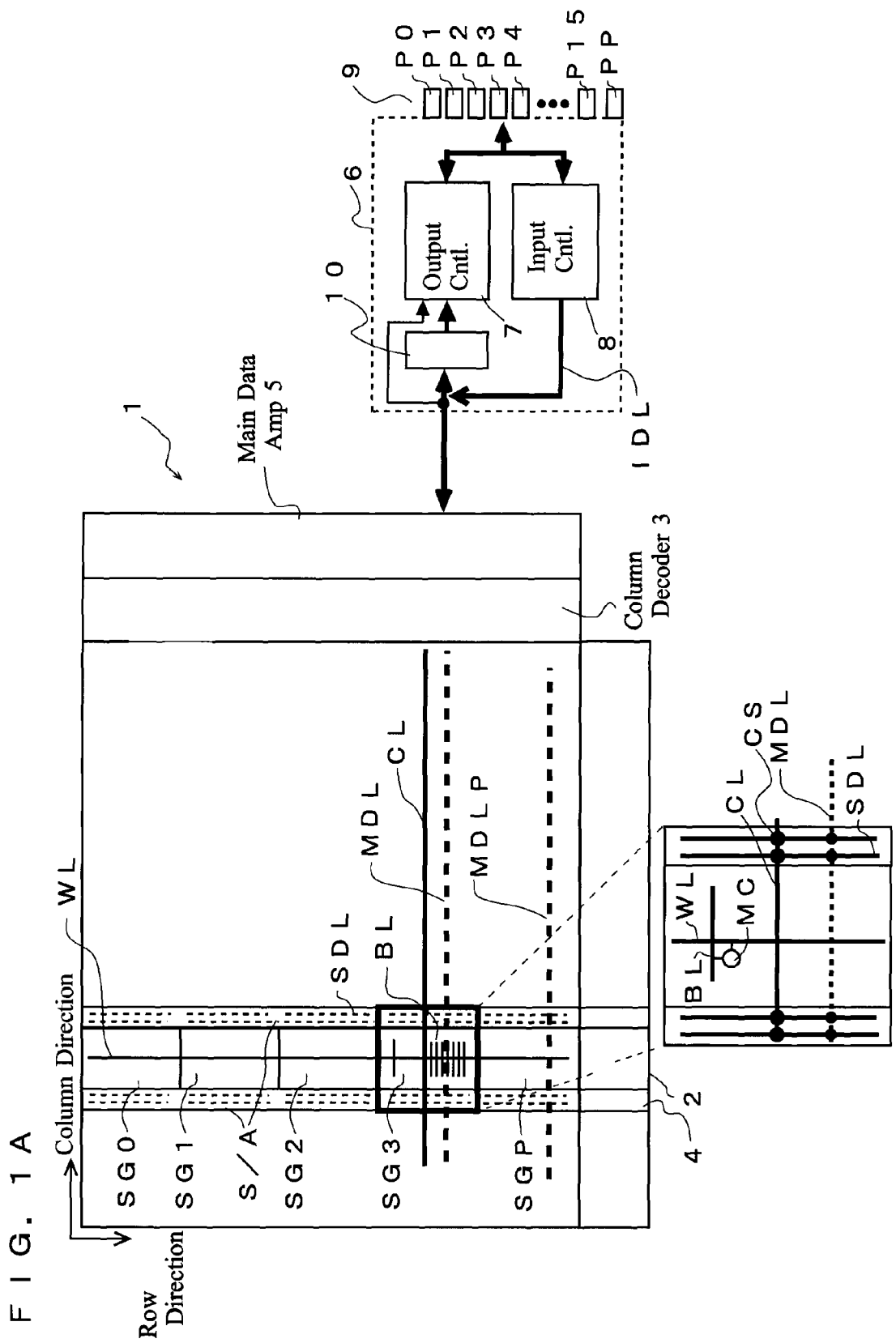

| IDLi | Expectation Value E | Output |
|------|---------------------|--------|
| L | L | H |
| L | H | L |
| H | L | L |
| H | H | H |

F I G. 1 1
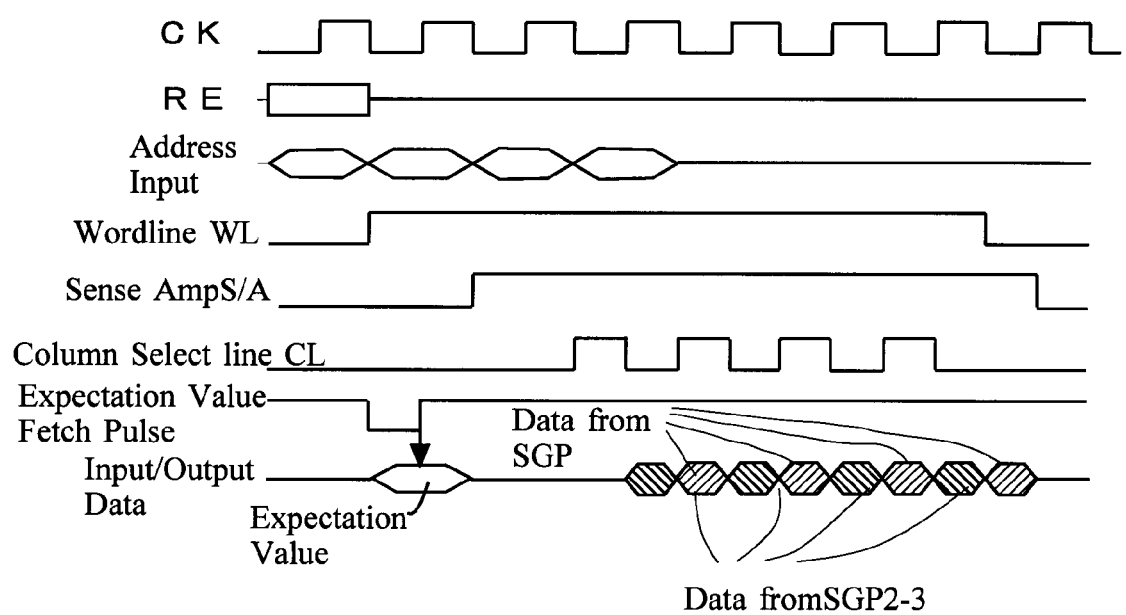

F I G. 1 3
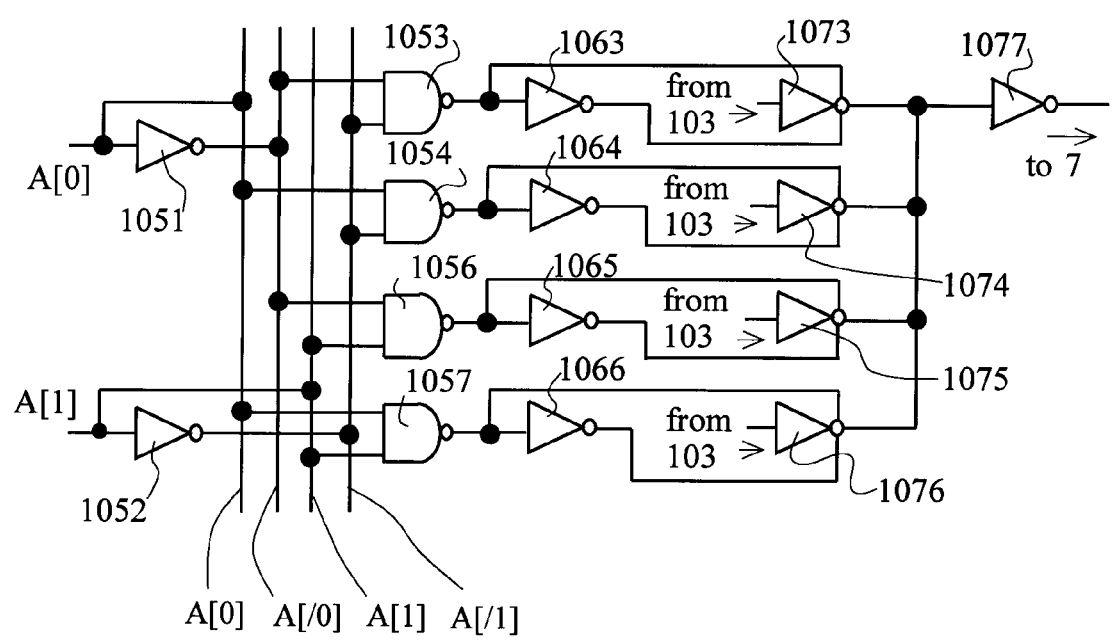

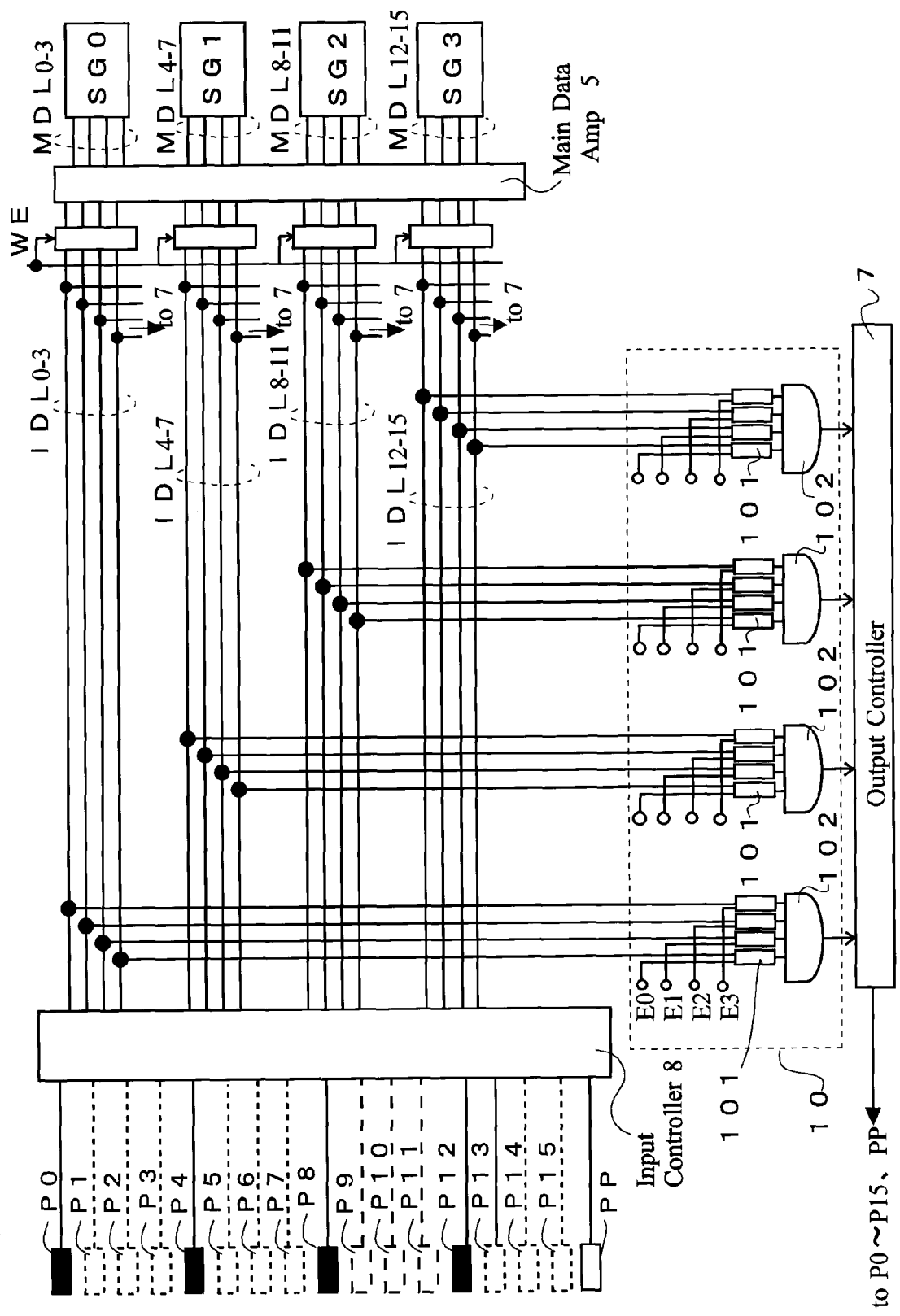
F I G. 15

US 8,074,144 B2

SEMICONDUCTOR STORAGE DEVICE

CROSS REFERENCE TO RELATED APPLICATIONS

This application is based on and claims the benefit of priority from prior Japanese Patent Application No. 2006-237285, filed on Sep. 1, 2006, the entire contents of which are incorporated herein by reference.

BACKGROUND OF THE INVENTION

1. Field of the Invention

The present invention relates to a semiconductor storage device, and more particularly, to a semiconductor storage device that may perform a die sort test for a memory cell.

2. Description of the Related Art

The semiconductor manufacturing process generally has a die sort test for a semiconductor chip when the chip is still a bare chip before packaging, the test being to check the chip's various properties and functions and the like. The die sort test is performed on the chips after they are diced, and also on the chips before they are diced, i.e., when they are on the semiconductor wafer.

It is required to reduce the test time of the die sort test on the chips on the semiconductor wafer. This is done by, for example, a group of chips formed on the wafer being probed collectively (see, for example, JP 2002-33360 (paragraphs [0002] to [0007] and the like)).

In the collective probing, fewer pins of each chip allow more chips to be tested at the same time, thus reducing the test time. Accordingly, compressing the input and output data from a plurality of data lines in each chip is performed to use fewer input/output pads than the data lines to input/output the test data (data compression).

It is difficult, however, to apply the data compression to a semiconductor storage device that may store parity data for error correction. Specifically, when the data compression is applied to the memory area for the parity data and the memory area for the normal data in the same way, the normal data and the parity data for error correction of the normal data cannot be read as being related to each other. Thus, it is difficult to decide whether redundancy rescue should be conducted or not.

SUMMARY OF THE INVENTION

A semiconductor storage device according to an aspect of the present invention comprises: a memory cell array including a plurality of word lines, a plurality of bit lines, and a plurality of memory cells formed at intersections of the word lines and the bit lines; a plurality of data lines reading cell data stored in the memory cell array when the data lines are connected to a selected bit line; a plurality of parity data lines reading parity data from a part of the memory cell array, the parity data being used for an error correction of the cell data stored in the memory cell; a first determination circuit that compares the cell data read from the data lines and their expectation value, respectively, and determines whether the data and the expectation value coincide, respectively; and a second determination circuit that compares the parity data read from the parity data lines and their expectation value, respectively, and determines whether the data and the expectation value coincide, respectively, the second determination circuit comprising a selection circuit that selectively outputs a determination result on a part of the parity data lines.

A semiconductor storage device according to an aspect of the present invention comprises: a memory cell array including a plurality of word lines, a plurality of bit lines, and a plurality of memory cells formed at intersections of the word lines and the bit lines; a plurality of data lines reading normal data stored in the memory cell when the data lines are connected to a selected bit line; a plurality of parity data lines reading parity data from a part of the memory cell array, the parity data being used for an error correction of the normal data stored in the memory cell; a selection circuit selecting a part of the parity data lines to transfer the parity data; a first determination circuit that compares the normal data read from the data lines and their expectation value, respectively, and determines whether the data and the expectation value coincide, respectively; and a second determination circuit that compares the parity data read from the parity data lines and their expectation value, respectively, and determines whether the data and the expectation value coincide.

BRIEF DESCRIPTION OF THE DRAWINGS

FIG. 1A shows a schematic configuration of a dynamic memory (DRAM) according to a first embodiment of the present invention.

FIG. 11 is a timing chart of a read operation of a die sort test according to the third embodiment.

FIG. 13 shows a configuration of the selection circuit 105 according to an embodiment of the present invention.

FIG. 15 shows configurations and operations of the input control circuit 8, the output control circuit 7, the error determination circuit 10 according to a sixth embodiment of the present invention.

DETAILED DESCRIPTION OF THE EMBODIMENTS

Figure 1B:
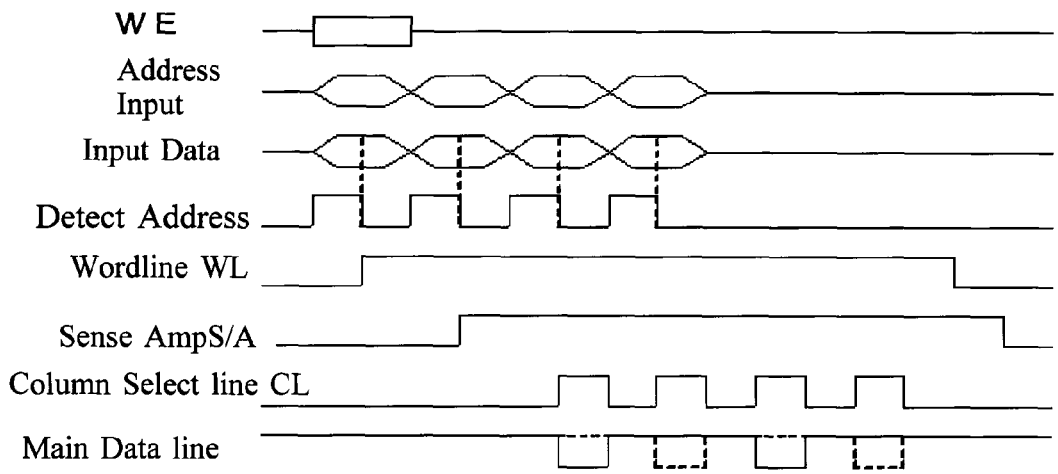
FIG. 1B is a timing chart of a normal data write operation of a semiconductor storage device according to the first embodiment.

With reference to the accompanying drawings, preferred embodiments of the present invention are described in more detail below.

First Embodiment

[Entire Configuration]

FIG. 1A shows a schematic configuration of a dynamic memory (DRAM) according to an embodiment of the present invention. The DRAM includes a memory cell array 1, a sense amplifier S/A, a row decoder 2, a column decoder 3, a sense amplifier control circuit 4, a main data amplifier 5, an input/output circuit 6, and an input/output pad 9.

The memory cell array 1 includes a plurality of word-lines WLs extending in a row direction, a plurality of bit-lines BLs extending in a column direction, and a plurality of memory cells MCs at the intersections between the WLs and the BLs. The MCs are thus arranged in a matrix. The memory cell array 1 is divided into a plurality of segments SGi (i=0 to 3 and P). Each segment SGi includes a plurality of word-lines WLs and a plurality of bit-lines BLs, which intersect each other. The segments SG0 to SG3 are areas for storing the normal data. The segment SGP is an area for storing parity data. The parity data is to determine an error in the normal data stored in the segments SG0 to SG3.

The segments SGs have both sides in the column direction on which sense amplifiers S/As are provided that sense and amplify the voltages of the bit-lines BLs. The row decoder 2 has a function of decoding the row address signal from outside to select the word-line WL. The column decoder 3 has a function of decoding the column address signal from outside to select the column-selection line CL. The sense amplifier control circuit 4 has a function of controlling the sense amplifier S/A to control the sensing and amplification of the sense amplifier S/A and to control the refresh operation for the memory cell MC and the like.

The column-selection line CL connects to a column switch CS. The column switch CS selectively connects the sense amplifier S/A and a sub data line SDL. The sub data line SDL resides on both sides of the segment SG and along the areas where the sense amplifiers S/As are formed. Four SDLs reside for one segment SG with two SDLs provided on each side (one sub data line SDL includes a pair of two wires so that it may transmit complementary data). One column-selection line CL may be activated to selectively connect four sub data lines SDLs and four bit-lines BLs (one bit line includes a pair of two wires so that it may transmit complementary data), respectively, via the sense amplifier S/A. Four main data lines MDLs connected to the four sub data lines SDLs extend in the column direction. A signal in the main data line MDL is amplified by the main data amplifier 5. The signal is then output via an output control circuit 7 in the input/output circuit 6 from the input/output pad 9.

Four main data lines MDLs reside, for example, for one segment SG (note, however, that one main data line MDL includes a pair of wires that transmit complementary data). To four segments SGs, therefore, 16 bit data may be read and write at the same time. Note that the segment SGP has a similar main data line MDLP extending therefrom. The parity data is written and read via the main data line MDLP.

The input/output circuit 6 includes the output control circuit 7, the input control circuit 8, and an error determination circuit 10. The output control circuit 7 controls an output of data read from the memory cell array 1. The input control circuit 8 controls an input of data from the input/output pad 9. The error determination circuit 10 determines an error of data read from the memory cell array 1 during the die sort test. It is assumed here that the input/output pad 9 includes 16 pads P0 to P15 for reading and writing normal data, a parity pad PP for outputting a determination result of data error of parity data.

This embodiment independently provides the input control circuit 8 and the output control circuit 7, thus providing different data paths for writing and reading. This is to make it possible to compress data in the die sort test, thus using fewer input/output pads in the test as described below. Note that data is compressed in the same units as the defective cell replacement operation. When four input/output pads are used in the test, the defective cell replacement operation for the memory cell array is performed in a unit of four bit lines.

This embodiment allows, in the normal data write and read operations, 16 bits to be written and read at the same time via the pads P0 to P15.

(Normal Data Write Operation)

Referring to FIG. 1B, a timing chart of the normal data write operation of the semiconductor storage device in the first embodiment is described blow. A not-shown control circuit inputs a write enable signal WE, an address signal, and input data. The address signal is then decoded by the row decoder 2 and the column decoder 3. The selected word-line WL and the corresponding sense amplifier S/A are activated. The decoded column address is then used to activate the column-selection line CL. At the same time, the main data line MDL receives input data transferred from the pads P0 to P15. The data of the main data line MDL is then transferred by the column switch CS to a specific sense amplifier via the sub data line SDL. After receiving the transferred data, the sense amplifier transfers the data via the bit-line BL to the cell capacitor.

(Normal Data Read Operation)

Figure 1C:
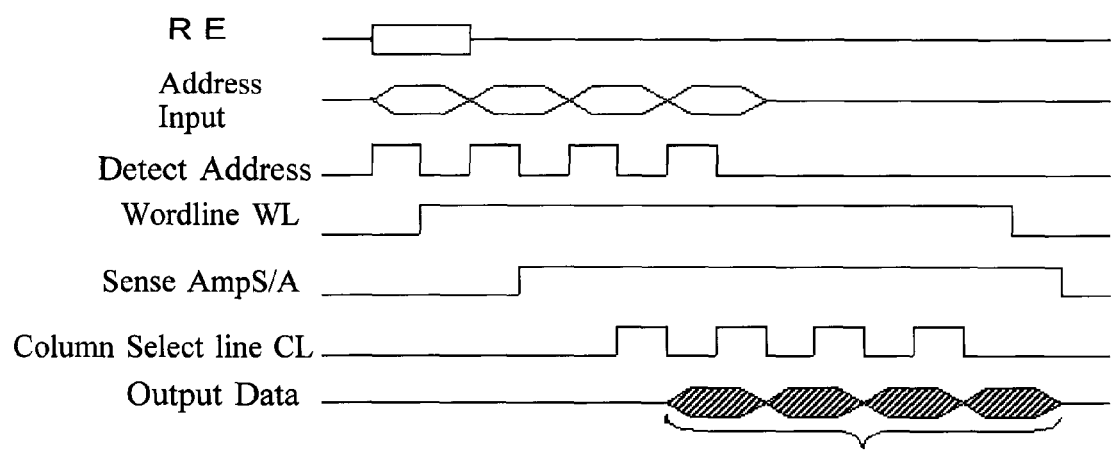
FIG. 1C is a timing chart of a normal data read operation of a semiconductor storage device according to the first embodiment.

Referring to FIG. 1C, a timing chart of the normal data read operation in the semiconductor storage device in the first embodiment is described below. A not-shown control circuit inputs a read-enable signal RE and an address signal. The address signal is then decoded by the row decoder 2 and the column decoder 3. The selected word-line WL and the corresponding sense amplifier S/A are activated. Information stored in a cell capacitor connected to the word-line WL thus appears in the bit-line BL. The information is then sensed and amplified by the sense amplifier S/A. The decoded column address is then used to activate the column-selection line CL. The read data is thus transferred to the main data line MDL. The data is then output via the output control circuit 7 or the like to the input/output pads P0 to P15.

(Die Sort Test)

In the die sort test, data is compressed to use fewer pads in the test. More chips may thus be tested at the same time, thereby reducing the test time. It is assumed here that among the pads P0 to P15, the four input/output pads P0, P4, P8, and P12, and one parity pad PP are used during the die sort test. The die sort test is performed by writing the test data from the four input/output pads P0, P4, P8, and P12 to each of the five segments SG1 to SG4 and SGP via 20 data lines, and reading the data therefrom.

When the four input/output pads P0, P4, P8, and P12 receive the test data of "L", "H", "L", and "H," respectively, the main data lines MDL0 to MDL3 of the segment SG0 receive the data of "L", "H", "L", and "H," respectively, which are then written to the segment SG0. Likewise, the main data lines MDL4 to MDL7 of the segment SG1 receive the data of "L", "H", "L", and "H", the main data lines MDL8 to MDL11 of the segment SG2 receive the data of "L", "H", "L", and "H", and the main data lines MDL12 to MDL15 of the segment SG3 receive the data of "L", "H", "L", and "H." All data are then written to the corresponding segments. During the reading, the written test data are read from the segments SGs. As described below, the test data are compared in the error determination circuit 10 with an expectation value E, thus determining an error for each segment SG. When an error is determined, the segment SG is faulty and is subject to a defect cell replacement.

Different data paths are selected between the normal data write/reading and the die sort test by the input control circuit 8 and the output control circuit 7.

[Input Control Circuit 8, Output Control Circuit 7, Error Determination Circuit 10]

Figure 2:
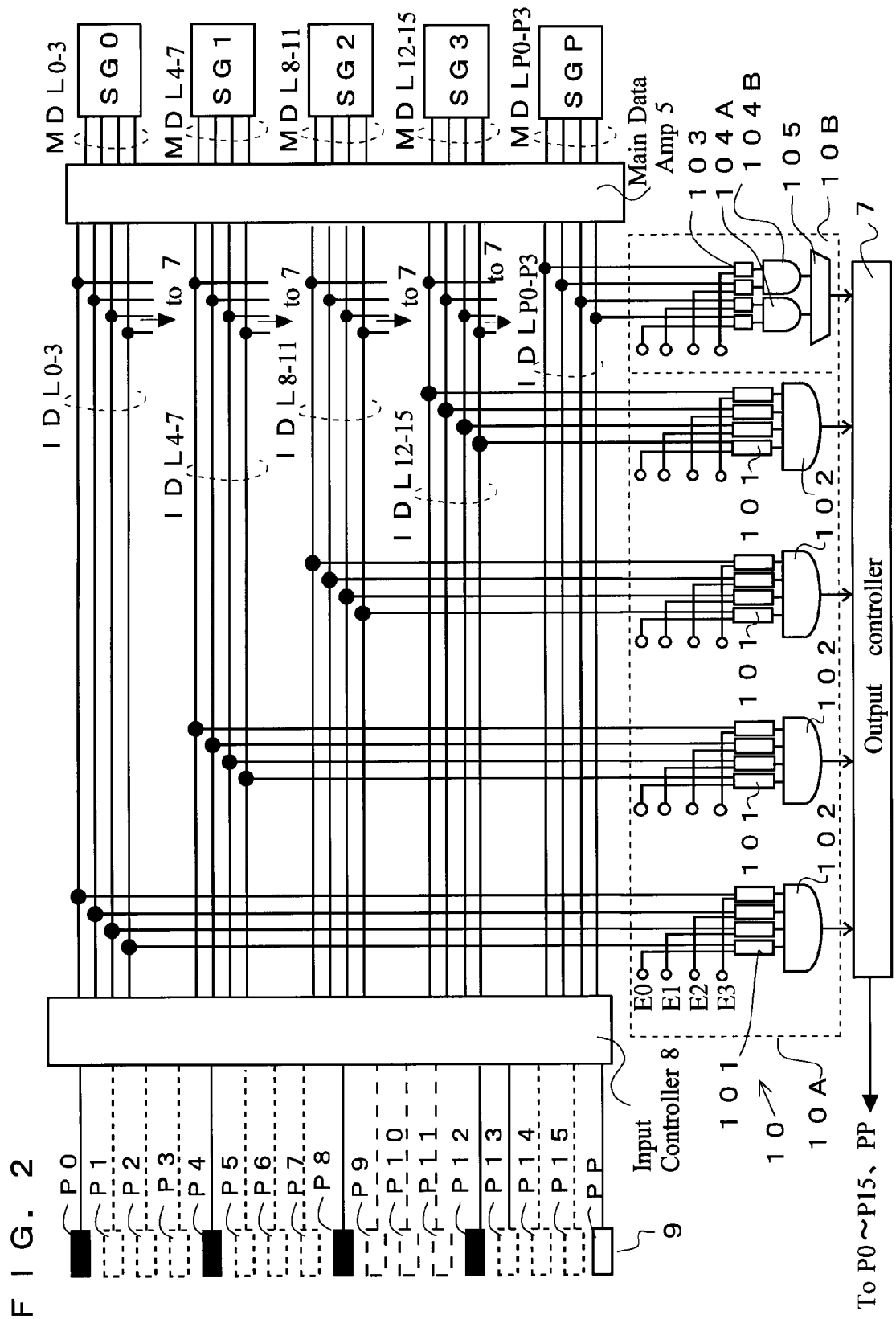
FIG. 2 shows configurations and operations of the input control circuit 8, the output control circuit 7, and the error determination circuit 10 in FIG. 1A.

FIG. 2 shows configurations and operations of the input control circuit 8, the output control circuit 7, and the error determination circuit 10. As described above, the input control circuit 8 selects different data paths between the normal data write operation and the die sort test.

Figure 3:
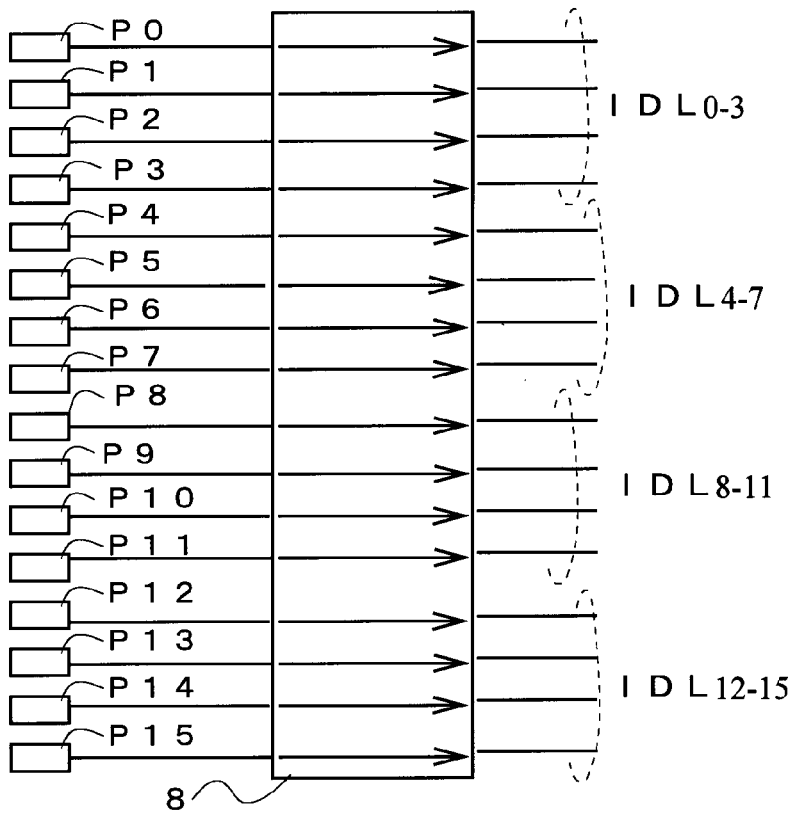
FIG. 3 illustrates a function of the input control circuit 8.
Figure 4:
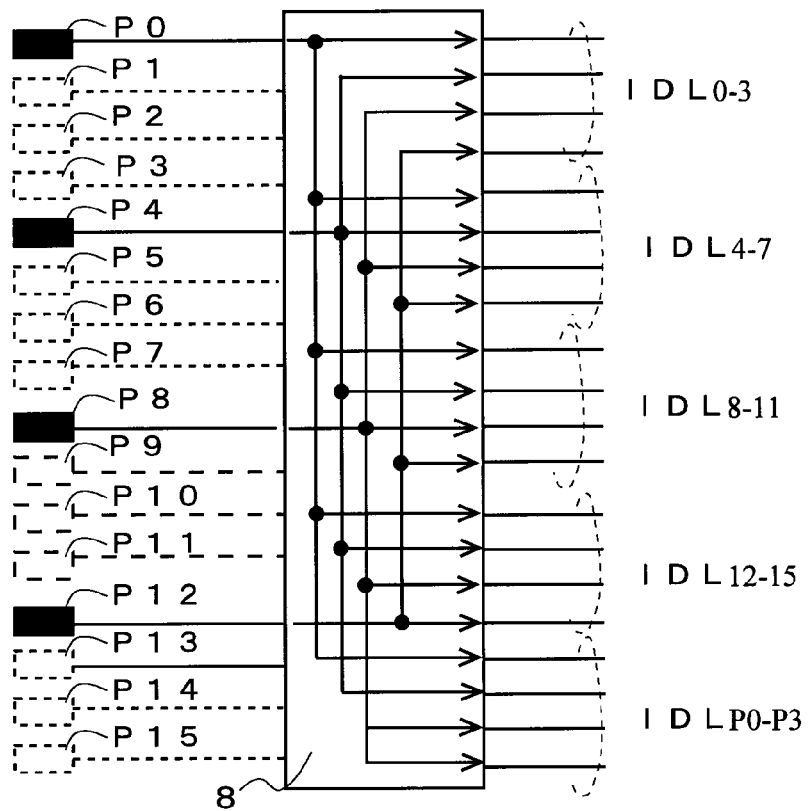
FIG. 4 illustrates a function of the input control circuit 8.

Referring to FIGS. 3 and 4, the function of the input control circuit 8 is described below. The input control circuit 8 receives, during the normal data write, data from the 16 pads P0 to P15 at the same time as shown in FIG. 3. The data is then directly output to the corresponding internal data lines IDL0 to IDL15. The internal data lines IDL0 to IDL3, IDL4 to IDL7, IDL8 to IDL11, and IDL12 to IDL15 are connected to the main data lines MDL0 to IDL3, MDL4 to IDL7, MDL8 to IDL11, and MDL12 to IDL15, respectively. Through the data lines, the normal data is written to the segments SG0 to SG3, respectively.

Referring to FIG. 4, during the die sort test, a not-shown multiplexer in the input control circuit 8 operates as follows. When receiving the test data from the input/output pads, only four pads P0, P4, P8, and P12 among the 16 pads are used and the other pads are not. Each of the four-bit data input to the four pads P0, P4, P8, and P12 is written to each of the segments SG0, SG1, SG2. SG3, and SGP.

For example, the test data from the pad P0 is input to the internal data lines IDL0, IDL4, IDL8, IDL12, and IDLP0 corresponding to the first main data lines NDL0, MDL4, MDLB, MDL12, and MDLP0 in the segments SGs, respectively.

The test data from the pad P4 is input to the internal data lines IDL1, IDL5, IDL9, IDL13, and IDLP1 corresponding to the second main data lines MDL1, MDL5, MDL9, MDL13, and MDLP1 in the segments SGs, respectively.

The test data from the pad P8 is input to the internal data lines IDL2, IDL6, IDL10, IDL14, and IDLP2 corresponding to the third main data lines MDL2, MDL6, MDL10, MDL14, and MDLP2 in the segments SGs, respectively.

The test data from the pad P12 is input to the internal data lines IDL3, IDL7, IDL11, IDL15, and IDLP3 corresponding to the fourth main data lines MDL3, MDL7, MDL11, MDL15, MDLP3 in the segment SGs, respectively.

The test data written to each segment SG is read to the error determination circuit 10 via the main data lines MDLs, the main data amplifier 5, and the internal data lines IDLs. The determination circuit 10 determines an error and faulty of the test data.

Referring to FIG. 2, the error determination circuit 10 includes a first determination circuit 10A and a second determination circuit 10B. The first determination circuit 10A determines errors of the segments SG0 to SG3. The second determination circuit 10B determines an error of the parity-data storage segment SGP.

The first determination circuit 10A includes 16 comparison circuits 101 and four AND circuits 102. The 16 comparison circuits 101 are divided into four sets of four circuits 101. The four AND circuits 102 are provided to the respective sets of the comparison circuits 101. Each segment SG is allocated with one set of (four) comparison circuits 101 and one AND circuit 102. One comparison circuit 101 for each segment SG includes input terminals and an output terminal. The input terminals has input lines connected thereto, respectively. The input lines include one of the corresponding internal data lines IDLs and an input line receiving the expectation value Ei. The output terminal outputs a coincidence signal between the input signals to the input terminals.

Figure 5:
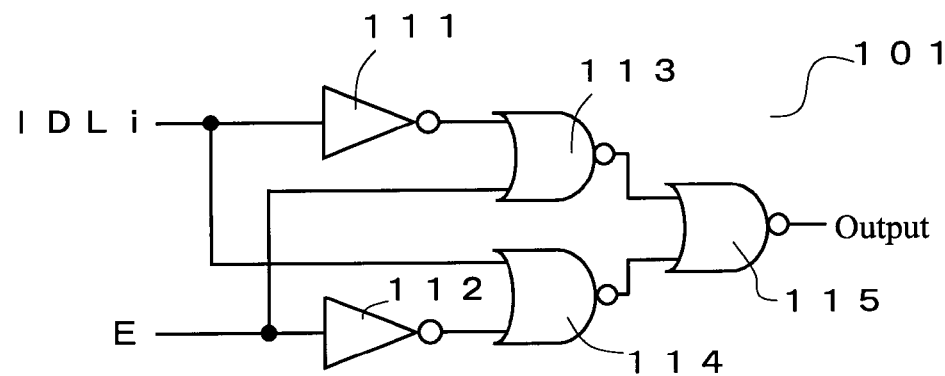
FIG. 5 shows a configuration of a comparison circuit 101 according to an embodiment of the present invention.

FIG. 5 shows a configuration of the comparison circuit 101 according to an embodiment of the present invention. The comparison circuit 101 includes inverter circuits 111 and 112 and NOR circuits 113, 114, and 115. The inverter circuit 111 has an input terminal to which the internal data line IDLi is connected. The inverter circuit 112' has an input terminal receiving the expectation value E from an external expectation value fetch circuit.

The inverter circuits 111 and 112 are followed by the NOR circuits 113 and 114, respectively. The NOR circuit 113 has input terminals receiving an output signal from the inverter circuit 111 and the expectation value E, respectively. The NOR circuit 114 has input terminals receiving an output signal from the inverter 112 and a signal of the internal data line IDLi, respectively. The output signals from the NOR circuits 113 and 114 are input to the NOR circuit 115. The output signal 115 from the NOR circuit 115 is the output signal from the comparison circuit 101. If the signal of the internal data line IDLi coincides with the expectation value E, the comparison circuit 101 provides an output signal of "H." If not, then the output signal is "L."

The output signals from the four comparison circuits 101 are input to the AND circuit 102. The output signal from the AND circuit 102 is "H" when all test data read from one segment SG via the four pairs of the main data lines MDLs is the same as the expectation value, thus recognizing no errors. The output signal is "L" when not all the test data is the same as the expectation value. Each output signal is thus one bit data to which four bit data is compressed. Overall, 16 bit data is compressed to four bit data. The compressed data is output from the output control circuit 7 to the input/output pads P0, P4, P8, and P12.

Note that during the normal data read operation, the data read to the 16 main data lines MDL0 to MDL15 does not pass through the error determination circuit 10, and is directly output to the output control circuit 7 and read to the corresponding input/output pads P0 to P15.

A configuration of the second determination circuit 108 is now described below. The second determination circuit 10B is adapted to determine whether the test data stored in the parity-data storage segment SGP has an error. The circuit 10B includes comparison circuits 103, AND circuits 104A and 104B, and a selection circuit 105. The comparison circuit 103 has a configuration similar to that of the comparison circuit 101. The circuit 103 compares the expectation value E input from outside and the values from the internal data lines IDLP0 to IDLP3, and outputs the comparison signal. Each of the AND circuits 104A and 104B receives outputs from two of the comparison circuits 103 at its input terminals. Each of the circuits 104A and 104B then outputs the logical product signal of the two outputs from the circuits 103. Specifically, the AND circuit 104A determines whether the data read from the internal data lines IDLP0 and IDLP1 are the same as the expectation value. The AND circuit 104B determines whether the data read from the internal data lines IDLP2 and IDLP3 are the same as the expectation value.

The selection circuit 105 has a function of selectively outputting, during the die sort test, according to an address signal selection specified by a not-shown control circuit, only one of the two inputs from the AND circuits 104A and 104B and shutting off the other. When, as described above, the die sort test includes the data compression, the parity-data storage segment SGP stores four-bit data like the segments SG0 to SG3 for storing the normal data. The parity data to determine an error of the normal 16 bit data read from the segments SG0 to SG3 is two bits, which are less than four bits. In the present embodiment, therefore, with four-bit data being read also from the segment SGP, the selection circuit 105 selectively reads only the corresponding two-bit data according to the address signal and shuts off (masks) the other data. Specifically, depending on the selected column-selection line CL, the selection circuit 105 selectively reads either the data output to the internal data lines IDLP0 and IDLP1, or the data output to the internal data lines IDLP2 and IDLP3. It prohibits the other data to be read. With the second determination circuit 10B thus configured, when the parity data is stored in the memory cell array 1, data may be written or read from the parity-data storage segment SGP using a data compression method similar to that used for the normal segments SG0 to SG3. In such a situation, the data selection may still correct an error of the normal data and determine whether the defective cell replacement is to be performed.

Figure 6A:
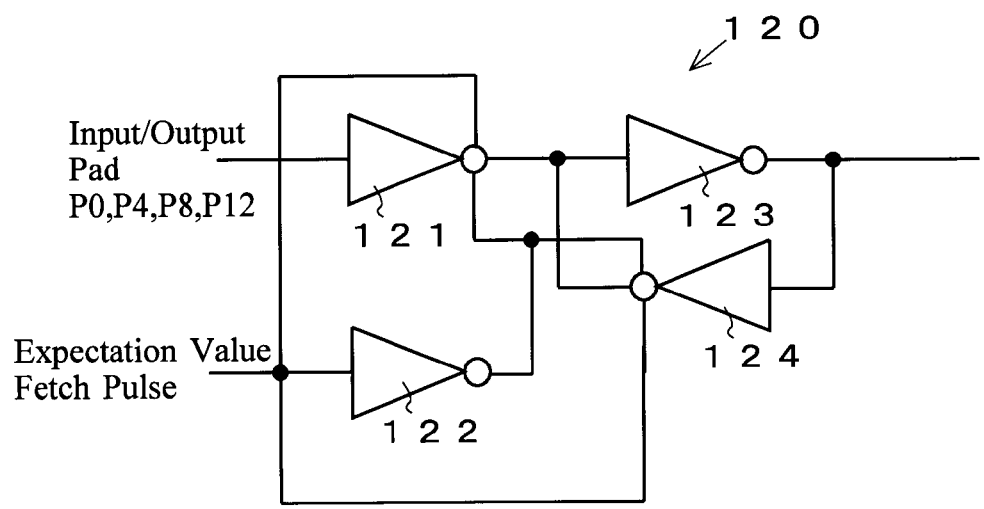
FIG. 6A shows a configuration of an expectation value fetch circuit 120 according to an embodiment of the present invention.

FIG. 6A shows a configuration of the expectation value fetch circuit according to an embodiment of the present invention. The expectation value fetch circuit 120 includes two clocked inverter circuits 121 and 124 and two inverter circuits 122 and 123. The clocked inverter circuit 121 receives input data that is input to the input/output pads P0, P4, P8, and P12. The inverter circuit 122 receives an expectation value fetch pulse as a trigger signal to acquire the expectation value, and generates an inversion signal of the expectation value fetch pulse. The expectation value fetch pulse and its inversion signal is input to the clocked inverters 121 and 124. The inverter circuit 123 and the clocked inverter circuit 124 form a latch circuit by connecting the output terminal of one circuit to the input terminal of the other. The data from the input/output pads P0, P4, P8, and P12 passes through the expectation value fetch circuit 120 when the expectation value fetch pulse is "L." The data is latched by the latch circuit including the inverter circuit 123 and the clocked inverter circuit 124 when the expectation value fetch pulse is "H."

Figure 6B:
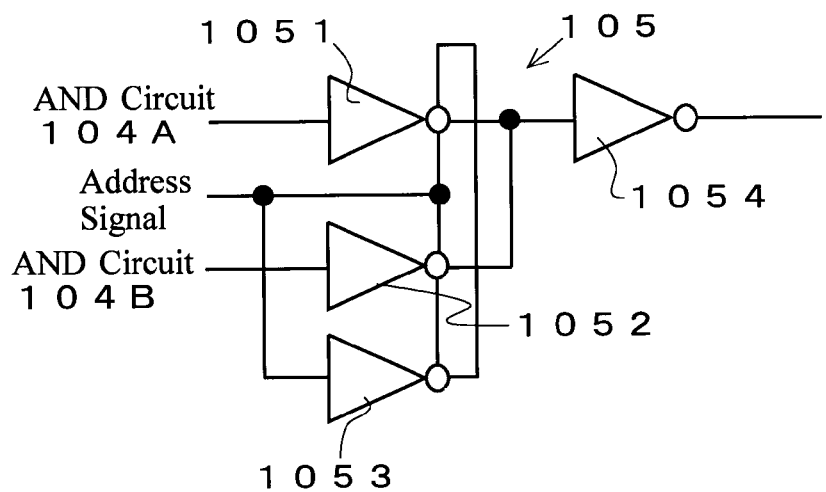
FIG. 6B shows a configuration of a selection circuit 105 according to an embodiment of the present invention.

FIG. 6B shows a configuration of the selection circuit 105 according to an embodiment of the present invention. The selection circuit 105 includes two clocked inverter circuits 1051 and 1052 and two inverter circuits 1053 and 1054. The clocked inverter circuit 1051 receives an output of the AND circuit 104A. The inverter circuit 1052 receives an output of the AND circuit 104B. The inverter circuit 1053 receives an address signal. The circuit 1053 then outputs, according to the logic of the address signal, either one of the outputs from the clocked inverter circuits 1051 or 1052 to the inverter circuit 1054.

Figure 7:
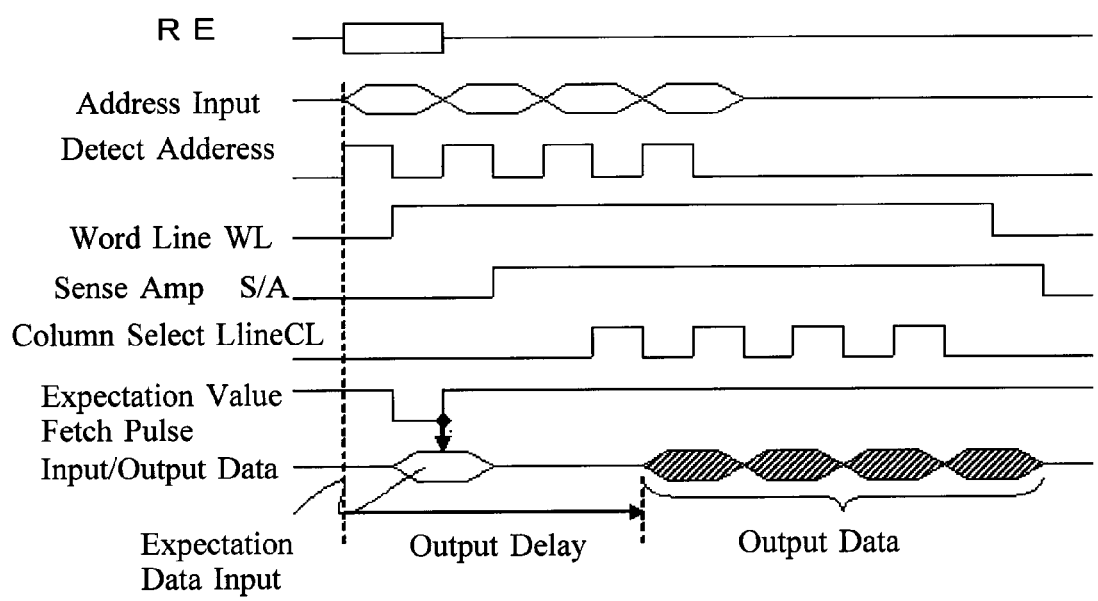
FIG. 7 is a timing chart of an operation (reading) during a die sort test in a semiconductor storage device according to the first embodiment.

FIG. 7 shows a timing chart of operation (reading) during a die sort test in a semiconductor storage device according to this embodiment. When the read-enable signal RE rises, the expectation value fetch pulse falls, thus allowing the expectation values E0 to E3 to be acquired from the expectation value fetch circuit 120. The expectation values E0 to E3 are then latched when the expectation value fetch pulse rises. At every rising edge of the column-selection line CL, the signals are compared with the expectation values E0 to E3 for error determination. The determination result is output, for each segment, from the input/output pads P0, P4, P8, P12, and PP. A delay time occurs between when the read-enable signal RE rises and when the output data is output. Within the delay time, the expectation value may be acquired from the expectation value fetch circuit 120 according to the expectation value fetch pulse.

Second Embodiment

Figure 8:
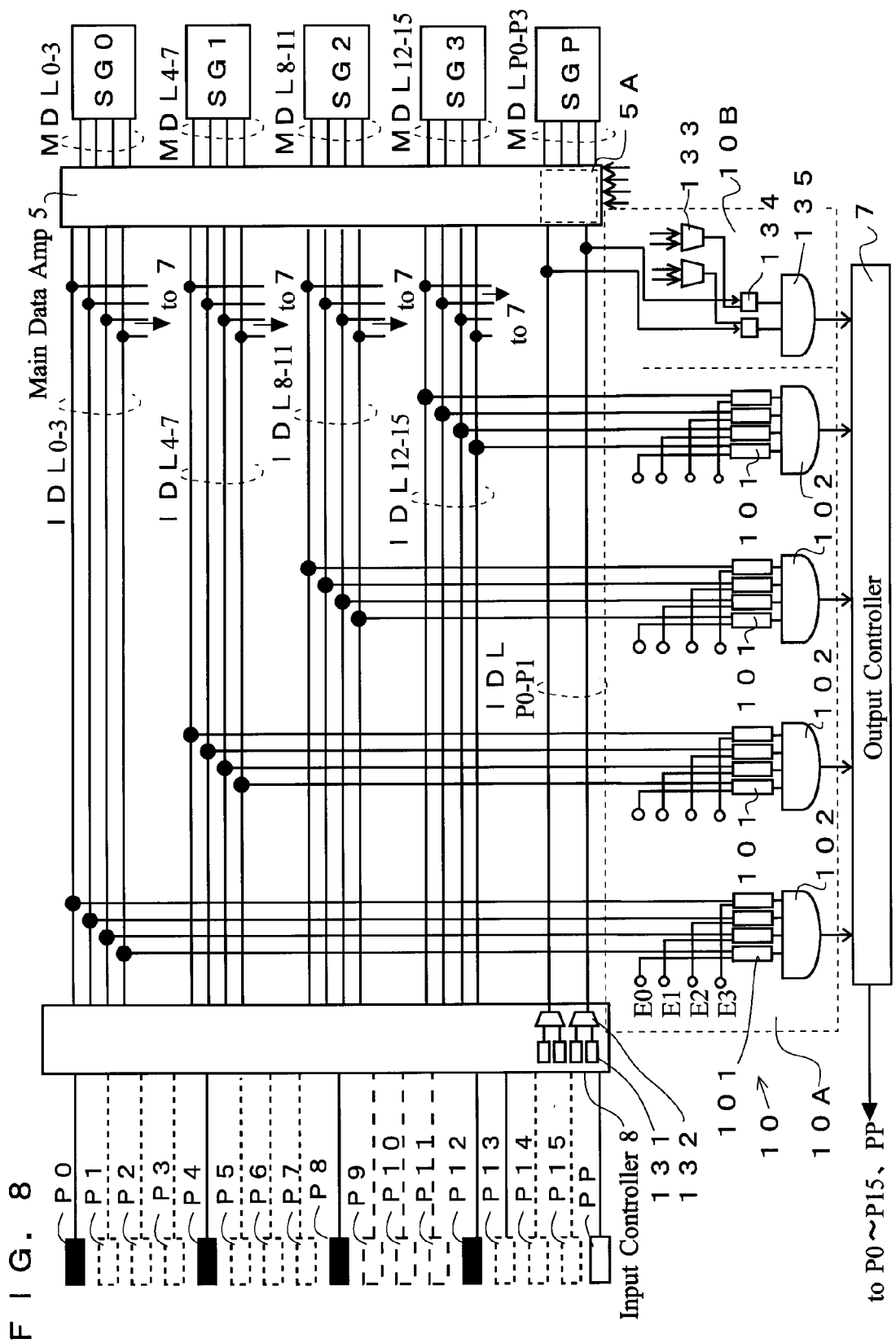
FIG. 8 shows configurations and operations of the input control circuit 8, the output control circuit 7, and the error determination circuit 10 according to a second embodiment of the present invention.
Figure 9:
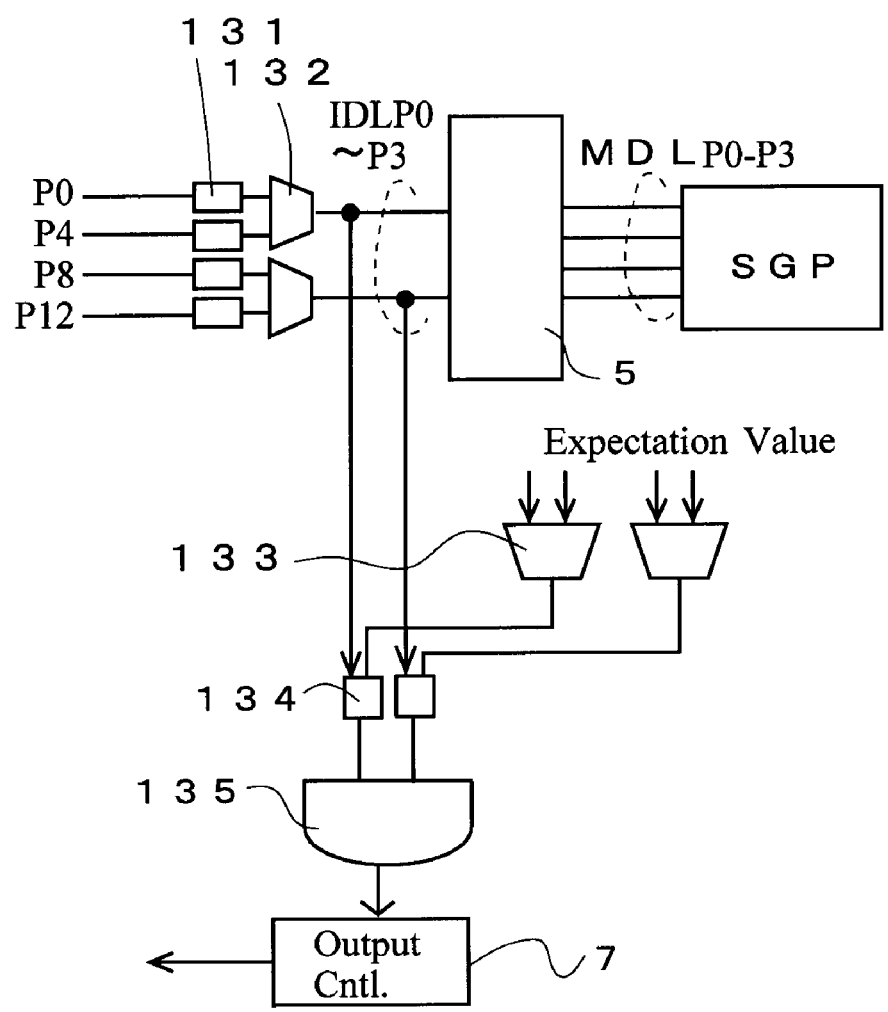
FIG. 9 is an enlarged view of a second determination circuit 10B and its periphery.

Referring to FIG. 8 or the like, a semiconductor storage device according to a second embodiment of the present invention is described below. The entire configuration is similar to that in the first embodiment shown in FIG. 1. FIG. 8 shows configurations and operations of the input control circuit 8, the output control circuit 7, and the error determination circuit 10 of the second embodiment. This embodiment is similar to the first embodiment (FIG. 2) except that the input/output control circuit 8, the internal data line IDL, and the second determination circuit 10B have different configurations. Like elements as those in the first embodiment are designated with like reference numerals and their detailed description is omitted here. FIG. 9 is an enlarged view of the second determination circuit 10B and its periphery according to the second embodiment.

This embodiment includes a latch circuit 131 in the input control circuit 8. The latch circuit 131 latches data from the input/output pads P0, P4, P8, and P12 corresponding to the parity-data storage segment SGP.

During the die sort test, the latch circuit 131 latches four-bit data for writing the test data, the four-bit data being transferred from the input/output pads P0, P4, P8, and P12. Two-bit data of the latched four-bit data is then selected by the selection circuit 132. Only the selected two-bit data is transferred via the internal data lines IDLP0 and IDLP1 to two of the main data lines MDLP0 to MDLP3 in the segment SGP. Two of the main data lines MDLP0 to MDLP3 are selected by the selection circuit SA in the main data amplifier 5 according to the address signal.

In this embodiment, during the die sort test, the parity-data storage segment SGP writes two-bit data using only two internal data lines IDLP0 and IDLP1, and reads data using two internal data lines IDLP0 and IDLP1. This embodiment thus includes fewer internal data lines writing to the segment SGP. The chip area may be reduced, accordingly.

Although not shown in FIG. 8, the four expectation value fetch circuits 120 as shown in FIG. 6A are provided. Each circuit 120 acquires the expectation value from the latch circuit 131 and stores it. The expectation value fetch circuit 120 (not shown) then transfers the expectation value to the selection circuit 133. The circuit 133 outputs, according to the address signal, two corresponding expectation values of the four expectation values to the comparison circuit 134 as the expectation values. The comparison circuit 134 and the AND circuit 135 have configurations and operations similar to those in the comparison circuit 103 and the AND circuit 104, respectively, in the first embodiment.

In the present embodiment, therefore, the latch circuit 131 and the selection circuit 132 may operate so that the parity-data storage segment SGP stores only two-bit test data and only the two-bit parity data is output when the test data is read.

The selection circuit 105 as in the first embodiment is thus unnecessary. In this embodiment, the segment SGP may be subject to the same data compression method as the segments SG0 to SG3 storing the normal data.

Third Embodiment

Figure 10:
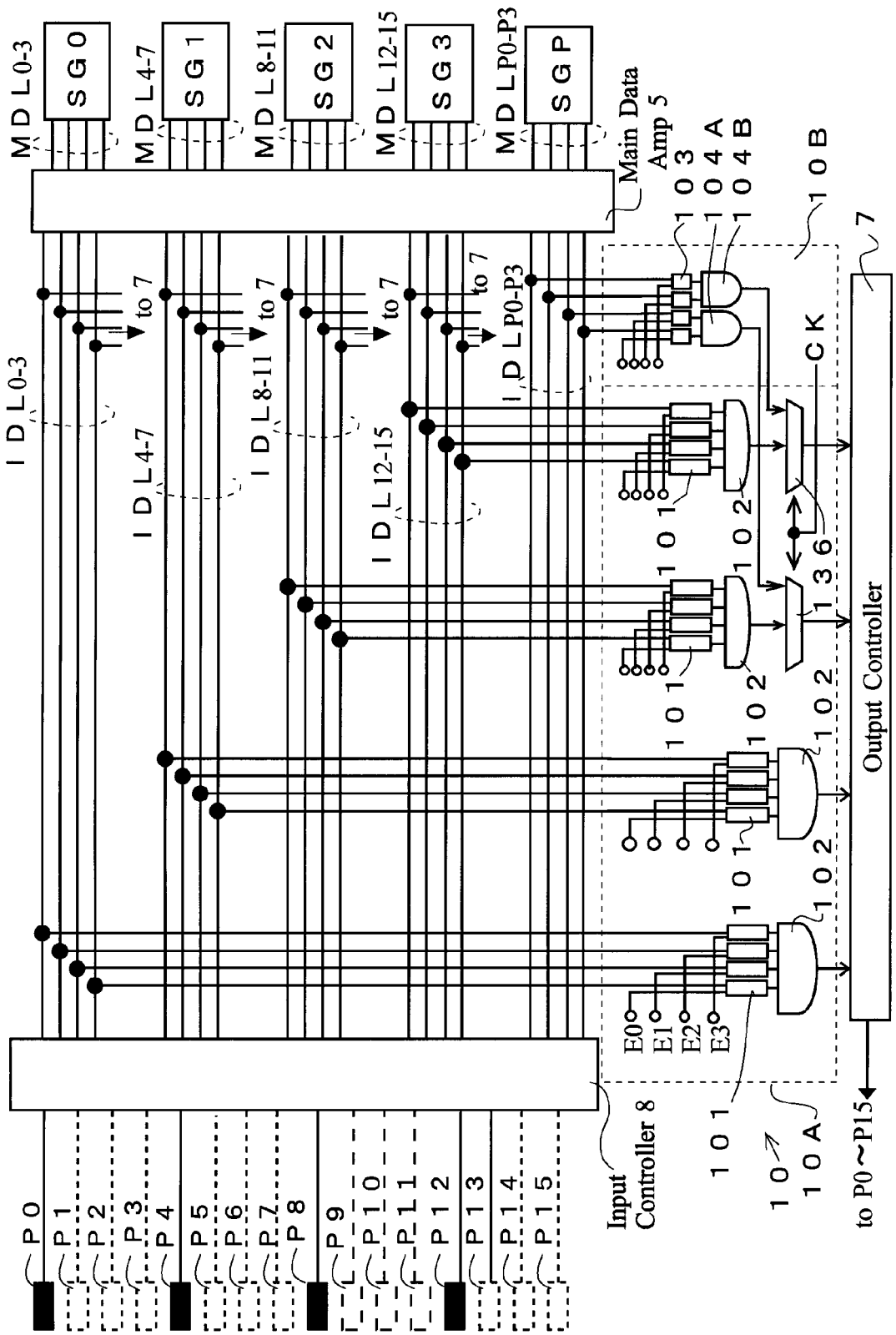
FIG. 10 shows configurations and operations of the input control circuit 8, the output control circuit 7, and the error determination circuit 10 according to a third embodiment of the present invention.

Referring to FIG. 10 or the like, a semiconductor storage device according to a third embodiment of the present invention is described below. The semiconductor storage device has an entire configuration similar to that in the first embodiment as shown in FIG. 1. Note, however, that this embodiment omits the parity input/output pad PP. Specifically, the determination results from the first and second determination circuits 10A and 103 are output from the same input/output pad. The other portions are similar and their detailed description is omitted here.

FIG. 10 shows configurations and operations of the input control circuit 8, the output control circuit 7, and the error determination circuit 10 of the third embodiment. Again, like elements as those in the first embodiment are designated with like reference numerals and their detailed description is omitted here.

Referring to FIG. 10, this embodiment differs from the above embodiments in that the parity input/output pad PP is not provided and the error determination result on the segment SGP is output from the pads P8 and P12.

In this embodiment, the parity-data storage segment SGP also includes the four internal data lines IDLP0 to IDLP3 as in the first embodiment. During the die sort test, the segment SGP is written, like the segments SG0 to SG3, with four-bit test data. The four-bit data are read from the segment SGP at the same time and are compared by the comparison circuit 103 with the expectation values. Each of the AND circuits 104A and 104B outputs "H" when two bits of the four bits are the same as the respective expectation values.

As in the first embodiment, the data stored in the segments SG0 to SG3 needs two-bit parity data to determine an error thereof. One of the determination outputs from the AND circuits 104A and 104B should thus be selected. In the present embodiment, the selection circuit 136 uses the rise and fall of the clock signal CK as the triggers. The circuit 136 allows the AND circuit 102 to output when the clock CK rises. The circuit 136 also allows the AND circuit 104A or 104B to output when the clock CK falls. The present embodiment eliminates the pad PP for outputting a faulty determination result on the segment SGP storing the parity data.

FIG. 11 shows a timing chart of the read operation of the die sort test in this embodiment. In synchronism with the clock CK, the read-enable signal RE and the address signal are input. In response to the signal RE and the address signal, the word-line WL, the sense amplifier S/A, and the column-selection line CL or the like operate in a similar way to that in the first embodiment. However, the data is output in a different way as follows. When the clock CK rises, the error determination results on the segments SG2 to SG3 are output, and between the outputs, when the clock CK falls, the fault determination result on the segment SGP is output.

Fourth Embodiment

Figure 12:
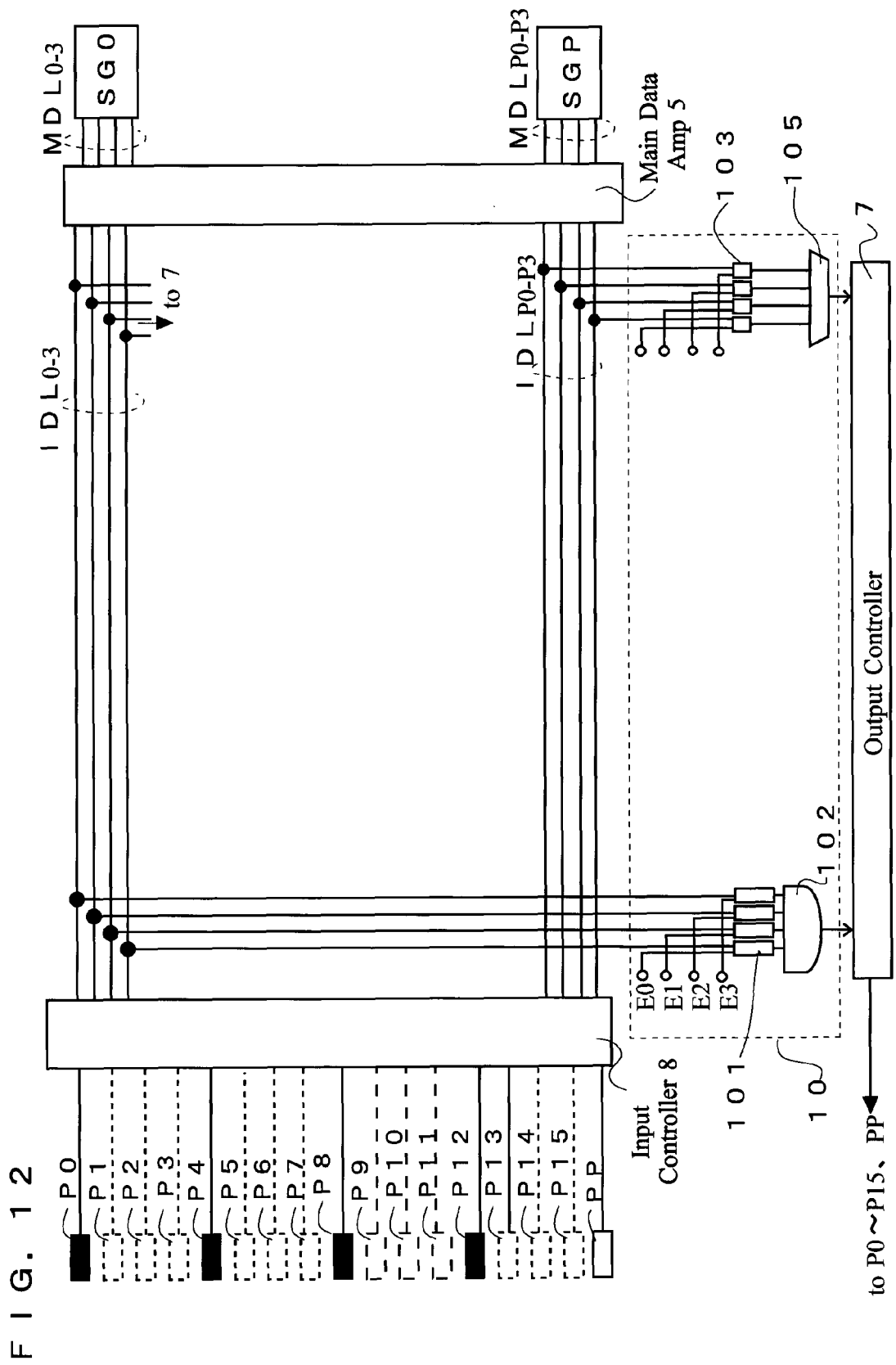
FIG. 12 shows configurations and operations of the input control circuit 8, the output control circuit 7, and the error determination circuit 10 according to a fourth embodiment of the present invention.

Referring to FIG. 12, a fourth embodiment according to the present invention is described below. The entire configuration is similar to that in the first embodiment shown in FIG. 1. FIG. 12 shows configurations and operations of the input control circuit 8, the output control circuit 7, and the error determination circuit 10 of the fourth embodiment. This embodiment includes fewer segments SGs to store the normal data. As in the first embodiment, during the die sort test, the test data from the four input/output pads P0, P4, P8, and P12 is written to the one segment SG0. The written test data is then read to the internal data lines IDL0 to IDL3. The test data is subject to the error determination in the first determination circuit 10A as in the first embodiment. The determination result is output from the output control circuit 7 to, for example, the input/output pad P0.

The parity-data storage segment SGP is written with four-bit test data via the internal data lines IDLP0 to IDLP3. The four-bit test data is then read to the internal data lines P0 to P3. The normal data is, however, as few as four bits, so the parity data to be read from the segment SGP is one bit. In this embodiment, therefore, among from the comparison results output from the comparison circuits 103, only one corresponding result is output from the selection circuit 105. The selection circuit 105 selectively sends, according to the address signal, one of the outputs from the four comparison circuits 103 to the pad PP via the output control circuit 7.

Referring to FIG. 13, a description is given below of a configuration of the selection circuit 105 according to an embodiment of the present invention. The selection circuit 105 includes inverters 1051 to 1052 and 1063 to 1066, clocked inverters 1073 to 1077, and NAND gates 1053 to 1056.

The circuit receives address data A [0], A [/0], A [1], and A [/1] to select one bit of the four-bit data. The inverters 1051 and 1052 receive the A [0] and the A [1] at their input terminals, respectively, thus generating the address data A [0], A [/0], A [1], and A [/1]. The NAND gates 1053 to 1056 output logical negation values of the logical products of the address data.

The outputs from the NAND gates 1053 to 1056 are inverted by the inverters 1063 to 1067, respectively. The inverters 1073 to 1076 have input terminals receiving comparison signals from the four comparison circuits 103, respectively. The inverters 1073 to 1076 are driven by the NAND gates 1053 to 1056 and the inverters 1063 to 1067, respectively. One of the outputs from the four comparison circuits 103 is thus selectively output.

Fifth Embodiment

Figure 14:
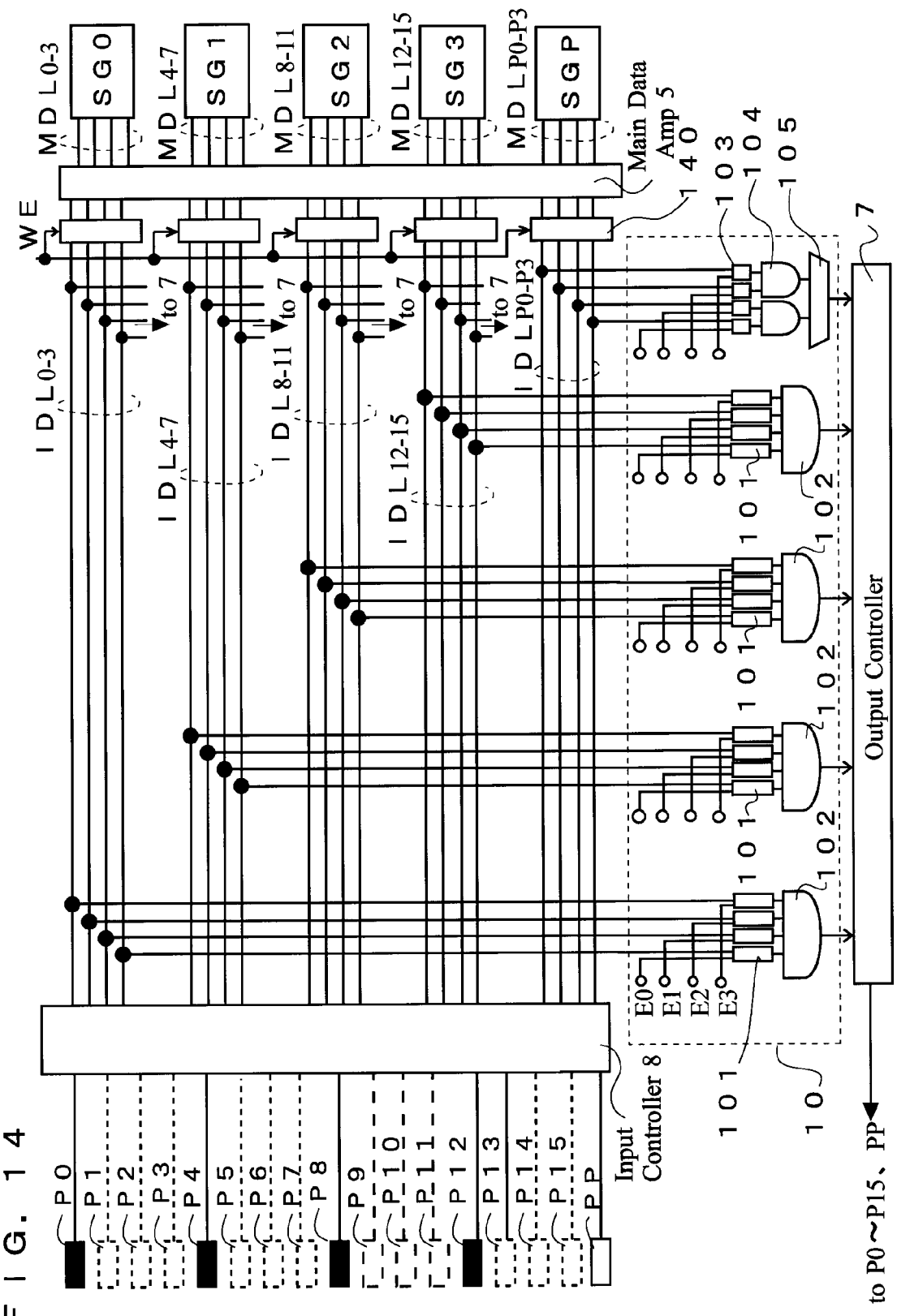
FIG. 14 shows configurations and operations of the input control circuit 8, the output control circuit 7, and the error determination circuit 10 according to a fifth embodiment of the present invention.

Referring to FIG. 14, a fifth embodiment of the present invention is described below. The entire configuration is similar to that in the first embodiment shown in FIG. 1. FIG. 14 shows configurations and operations of the input control circuit 8, the output control circuit 7, and the error determination circuit 10 of the fifth embodiment. This embodiment differs from the above embodiments in that an expectation value fetch circuit 140 is provided in the internal data line IDL and the expectation value is acquired when data is written in the die sort test. The expectation value acquired by the expectation value fetch circuit 140 is input to the comparison circuit 103. The other configurations are similar to those in the first embodiment.

Sixth Embodiment

Referring to FIG. 15, a sixth embodiment of the present invention is described below. The entire configuration is similar to that in the first embodiment shown in FIG. 1. FIG. 15 shows configurations and operations of the input control circuit 8, the output control circuit 7, and the error determination circuit 10 of the sixth embodiment. This embodiment is similar to the fifth embodiment in that the expectation value fetch circuit 140 is provided in the internal data line IDL and the expectation value is acquired when data is written in the die sort test. Note, however, that this embodiment differs from the above embodiments in that the parity data is not stored, and only the normal data is subject to the error determination using the expectation value according to the data compression method.

Thus, although the invention has been described with respect to particular embodiments thereof, it is not limited to those embodiments. It will be understood that various modifications and additions and the like may be made without departing from the spirit of the present invention. Although, for example, the above embodiments read 16 bit data at the same time using four main-data lines extending from one segment, a part of the column address may be disregarded to allow more column-selection lines to operate in one segment, allowing more bits to be read at the same time.

What is claimed is:

1. A semiconductor storage device comprising:
    a memory cell array including a plurality of word lines, a plurality of bit lines, and a plurality of memory cells formed at intersections of the word lines and the bit lines;
    a plurality of data lines reading normal data stored in a first area in the memory cell array when the data lines are connected to a selected bit line;
    a plurality of parity data lines reading parity data from a second area in the memory cell array, the second area being different from the first area, the parity data being used for an error correction of the normal data stored in the memory cell;
    a first determination circuit that compares the normal data read from the data lines and their expectation values, respectively, and determines whether the data and the expectation values coincide, respectively; and
    a second determination circuit that compares the parity data read from the parity data lines and their expectation values, respectively, and determines whether the data and the expectation values coincide, respectively,
    the second determination circuit comprising a selection circuit that selectively outputs a part of determination results of the second determination circuit and shuts off a remaining one of the determination results.

2. The semiconductor storage device according to claim 1, further comprising:
    an input control circuit that receives data from a plurality of input/output pads and writes the data via the data line or the parity data lines in the memory cell array; and
    an output control circuit that outputs data read out from the memory cell array via the data lines or the parity data lines to the plurality of input/output pads.

3. The semiconductor storage device according to claim 1, wherein the first determination circuit comprises a logical product circuit that operates a logical product of determination results on data output via the plurality of data lines.

4. The semiconductor storage device according to claim 1, wherein
    the first area comprises a plurality of segments, each segment existing as one storage unit, and the data lines are divided into a plurality of sets of Q data lines, each set extending corresponding to each segment, and wherein
    the first determination circuit comprises a logical product circuit that operates a logical product of determination results on data output via the Q data lines.

5. The semiconductor storage device according to claim 4, further comprising:
    an input control circuit that receives Q-bit test data from Q input/output pads and inputs the Q-bit test data to each of the segments; and
    an output control circuit that compresses data of determination results by the first determination circuit on Q-bit test data read from each of the segments and outputs the compressed data from each of the Q input/output pads.

6. The semiconductor storage device according to claim 5, further comprising a parity pad that outputs a second determination signal indicating a determination result by the second determination circuit.

7. The semiconductor storage device according to claim 1, further comprising an output switching circuit that receives the first determination signal from the first determination circuit and the second determination signal from the second determination circuit to output in turn the first determination signal and the second determination signal according to a clock signal.

8. A semiconductor storage device comprising:
    a memory cell array including a plurality of word lines, a plurality of bit lines, and a plurality of memory cells formed at intersections of the word lines and the bit lines;
    a plurality of data lines reading normal data stored in the memory cell when the data lines are connected to a selected bit line;
    a plurality of parity data lines reading parity data from a part of the memory cell array, the parity data being used for an error correction of the normal data stored in the memory cell;
    a selection circuit selecting a part of the parity data lines to transfer the parity data;
    a first determination circuit that compares the normal data read from the data lines and their expectation value, respectively, and determines whether the data and the expectation value coincide, respectively; and
    a second determination circuit that compares the parity data read from the parity data lines and their expectation value, respectively, and determines whether the data and the expectation value coincide.

9. The semiconductor storage device according to claim 8, further comprising:
    an input control circuit that receives data from a plurality of input/output pads and writes the data via the data line or the parity data lines in the memory cell array; and
    an output control circuit that outputs data read out from the memory cell array via the data lines or the parity data lines to the plurality of input/output pads.

10. The semiconductor storage device according to claim 8, wherein the input control circuit includes:
    a latch circuit that latches parity data input from the plurality of input/output pads; and
    a selection circuit that selects parity bits of certain bits out of plural-bit parity data latched.

11. The semiconductor storage device according to claim 10, wherein the second determination circuit further comprises a selection circuit that selects an expectation value corresponding to parity data selected in the selection circuit, among the plurality of expectation values.

12. The semiconductor storage device according to claim 9, wherein the first determination circuit comprises a logical product circuit that operates a logical product of determination results on data output via the plurality of data lines.

* * * * *